US006657432B1

(12) United States Patent
Morrone

(10) Patent No.: US 6,657,432 B1
(45) Date of Patent: Dec. 2, 2003

(54) GRADIENT COILS FOR MRI SYSTEMS HAVING MULTIPLE CURRENT DENSITY ZONES

(75) Inventor: Terry Morrone, Melville, NY (US)

(73) Assignee: Fonar Corporation, Melville, NY (US)

(*) Notice: Subject to any disclaimer, the term of this patent is extended or adjusted under 35 U.S.C. 154(b) by 0 days.

(21) Appl. No.: 10/254,958

(22) Filed: Sep. 25, 2002

(51) Int. Cl.⁷ .................................................. G01V 3/00
(52) U.S. Cl. ...................... 324/309; 324/307; 324/318
(58) Field of Search ................................ 324/309, 310, 324/311, 312, 307, 318, 319, 320; 600/411

(56) References Cited

U.S. PATENT DOCUMENTS

| | | | | |
|---|---|---|---|---|
| 4,670,716 A | * | 6/1987 | Kunz | 324/309 |
| 4,766,379 A | * | 8/1988 | Miyazaki et al. | 324/309 |
| 5,502,385 A | * | 3/1996 | Kuhan et al. | 324/309 |
| 6,362,623 B1 | * | 3/2002 | Goto | 324/318 |
| 6,400,151 B1 | * | 6/2002 | Haase et al. | 324/309 |

* cited by examiner

Primary Examiner—Diego Gutierrez
Assistant Examiner—Brij B. Shirvastav
(74) Attorney, Agent, or Firm—IP Strategies, P.C.

(57) ABSTRACT

A process of providing a gradient field includes providing a pair of opposing magnets and associated magnet poles, which are divided into zones. For each zone, a target current density is determined, and is modeled after a mathematical series, at least two of which are different. Gradient coils are formed from wires disposed on the magnet poles along paths corresponding to the mathematical series. A current source is connected to the gradient coils to provide the gradient field. A magnetic resonance imaging system includes a pair of opposing magnets and magnet poles, and a pair of gradient coils. The gradient coils are formed from wires disposed along paths on each magnet pole, which are divided into zones defined by a shape of the wire path in that zone. The shape in each zone corresponds to a mathematical series, which are different in at least two of the zones.

44 Claims, 3 Drawing Sheets

GRADIENT COILS FOR MRI SYSTEMS HAVING MULTIPLE CURRENT DENSITY ZONES

BACKGROUND OF THE INVENTION

The present invention relates to gradient coils, for example, those used in nuclear magnetic resonance (NMR) imaging systems. Gradient coils can be used to produce linear fields, as part of a process for producing images of a target object.

Nuclear magnetic resonance imaging is one of the most versatile and fastest growing modalities in medical imaging. Since the discovery by Dr. Raymond Damadian in the early 1970s that nuclear magnetic resonance techniques can be used to scan the human body to yield useful diagnostic information, medical NMR imaging devices have been developed for obtaining NMR images of the internal structures of patients. Subsequently, much effort has been expended to improve and refine the techniques used for obtaining NMR images, as well as to determine the diagnostic utility of NMR images. As a result, NMR imaging, or magnetic resonance imaging (MRI), as it is sometimes known, has today proven to be an extremely useful tool in the medical community for the purposes of detecting and diagnosing abnormalities within the body.

Conventional magnetic resonance imaging techniques generally utilize pulsed magnetic field gradients to spatially encode NMR signals from various portions of an anatomical region of interest. The pulsed magnetic field gradients, together with radio frequency excitation of the nuclear spins and acquisition of signal information, are commonly referred to as a pulse sequence.

The basic science behind NMR imaging is well known. Pulsed current through a set of conductors will produce a magnetic field external to the conductors; the magnetic field generally has the same time course of development as the current in the conductors. The conductors may be distributed in space to produce three orthogonal gradients X, Y, and Z. Each of the gradients can be independently pulsed by a separate time-dependent current waveform.

In order to construct images from the collection of NMR signals, conventional NMR imaging equipment generally utilizes magnetic field gradients for selecting a particular slice or plane of the object to be imaged and for encoding spatial information into the NMR signals. For example, one conventional technique involves subjecting an object to a continuous static homogenous field extending along a first direction, and to sets of sequences of orthogonal magnetic field gradients. Each set of orthogonal magnetic field gradient sequences generates a magnetic field component in the same direction as the static field, but the sequences have strengths that vary along the direction of the gradients.

Generally, the NMR phenomenon occurs in atomic nuclei having an odd number of protons and/or neutrons. Due to the spins of the protons and neutrons, each such nucleus exhibits a magnetic moment. As a result, when a sample composed of such nuclei is placed in the homogeneous magnetic field, a greater number of nuclear magnetic moments align with the direction of the magnetic field to produce a net macroscopic magnetization in the direction of the field. Under the influence of the magnetic field, the magnetic moments precess about the axis of the field at a frequency that is dependent upon the strength of the applied magnetic field and on the characteristics of the nuclei. The angular precession frequency, co, also referred to as the Larmor frequency, is given by the equation $\omega = \gamma B$, where $\gamma$ is the gyro-magnetic ratio (which is a constant for each particular atomic nucleus) and B is the strength of the magnetic field acting upon the nuclear spins.

A typical imaging procedure involves the use of three orthogonal magnetic field gradients, X, Y, and Z, which are pulsed coordinately. For example, the Z gradient is pulsed on for two brief time periods. A 90-degree radio frequency pulse in the first time period and a 180-degree; radio frequency pulse in the second time period are used to select a slice of the anatomy of interest, and to induce the nuclear spin system within that slice to generate an NMR signal. Once the slice is selected by the Z gradient, the two remaining orthogonal gradients are used to confer spatial encoding on the NMR signal in the two orthogonal directions. For example, the Y gradient will encode on the basis of phase advances imparted on a series of signal responses by using a pulsed gradient waveform of progressively increasing area. The X gradient, which is pulsed on during the signal collection period, will frequency-encode the NMR signal in the third orthogonal direction.

When the excitation pulse is stopped, the nuclear spins tend to slowly realign or relax back to the equilibrium position. At this time, the spins emit an NMR signal, which can be detected with an RF receiver coil (which can be, and often is, the same coil as that used with the transmitter). The emitted NMR signal is dependent on three basic parameters, namely, the density of the excited nuclei, the spin-lattice (longitudinal) relaxation time (T1), and the spin-spin (transverse) relaxation time (T2). The latter two parameters are both exponential time constants that characterize the rate of return to equilibrium of the longitudinal and transverse magnetization components following the application of the perturbing RF pulse. These NMR parameters of spin density, T1, and T2 are related to the atomic nuclei subjected to the NMR phenomenon.

The NMR signal is processed to yield images that give a representation of the anatomical features in the selected slice, as well as provide soft tissue contrast. NMR signals can be processed using various algorithms, depending upon the precise nature of the data acquisition procedure. However, all of these methods rely on the ability to spatially encode the signal information by making use of the magnetic field gradients, which are time modulated and sequentially pulsed in various modes to effectuate the desired result.

For example, the received NMR signals can be transformed by utilizing, for example, conventional two-dimensional Fourier transform techniques. The magnetic field and phase-encoding magnetic field gradients encode spatial information into the collection of NMR signals so that two-dimensional images of the NMR signals in the selected plane can be:constructed. During the scanning sequence, the various magnetic field gradients are repeatedly switched on and off at the desired intervals.

Gradients are often designed using some sort of a target field approach. That is, a target field is determined based on parameters of the imaging task, such as the dimensions and composition of the imaging object. Then a gradient coil is constructed based on the current density required to produce the target field. A current density function can be represented by a truncated generalized Fourier series in two dimensions. An orthogonal set of functions, such as sines and cosines or Bessel functions, can be used. The coefficients of the generalized Fourier series are computed so as to minimize error, that is, to minimize the difference between the field produced by this current density and the ideal target field. The gradient coil is then constructed by designing wire paths that most closely approximate the current density that produces the minimum error, when current flows through the wire paths.

MRI systems, such as vertical field MRI systems, usually have round magnet poles. However, rectangular poles can be useful for magnets used as a part of a system to image a patient during surgery or when a very long field of view in one direction is desired. The method for determining gradient layout described above works well for round poles, but is less effective for a design utilizing rectangular poles, which conventionally would use straight wires to carry the field-producing current. These straight wires must have a return for the current, and conventionally yield a good gradient only if the loops can be closed very far from the region of interest, approximating an infinite filamentary current. Thus, improved gradient coils for rectangular magnet poles would be advantageous for use in MRI systems.

BRIEF SUMMARY OF THE INVENTION

The present invention provides gradient, coils that include different types of wire paths over different zones of the magnet pole. For example, the gradient coils can combine straight wires with conventional curved wires (derived, for example, from a Fourier series), so that a linear gradient over a rectangular pole of finite dimensions is achieved. In such a case, the straight wires provide the linear gradient, and the curved wires act as current returns, but are designed to interfere only minimally with the linear gradient, and to minimize field effects outside the zones that have the gradient coils. The coefficients of the generalized Fourier series determining the current density in each zone are selected to produce the target field. The present invention is contemplated for use with both self-shielded (two-plane) and single-plane gradient coils. In the case of self-shielded gradient coils, the shield wires are derived from the primary wires and are slightly curved in the region where the primary wires are straight.

Thus, according to one aspect of the present invention, a process of providing a gradient field includes providing a pair of opposing magnets and associated magnet poles on opposite sides of an imaging volume, and dividing each magnet pole into a plurality of zones. For each zone, a target gradient field is determined, as well as a target current density that corresponds to the target gradient field. The target current density for each zone is modeled after a mathematical series, such that at least one mathematical series modeling the target current density for one corresponding zone is different than at least one other mathematical series modeling the target current density for another corresponding zone, and such that the mathematical series modeling the current densities at boundaries of adjacent zones are continuous. Gradient coils are formed from a plurality of discrete wires. The discrete wires are disposed on the respective magnet poles along wire paths corresponding to the mathematical series modeling the target current density for the respective zones. A current source is connected to the gradient coils to provide currents through the gradient coils, thereby providing the gradient field.

The mathematical series can approximate the target current densities according to predetermined design constraints. The number of terms of the mathematical series can be limited according to the design constraints. The the gradient field can be a linear gradient field in a target region of the imaging volume. The target region can be a rectangular cross-section in a plane parallel to opposing surfaces of the poles.

The mathematical series can be, for example, a truncated generalized Fourier series, which can be an orthogonal set of functions, such as those including a Bessel function, or a function including at least one sinusoidal term.

The poles can be rectangular-shaped. Dividing each magnet pole into a plurality of zones can include dividing each magnet pole into three zones. For example, each magnet pole can be disposed in a plane z=constant, with reference to a Cartesian coordinate system. The first zone can then be defined as bounded by the lines x=±a and y=±c, the second zone can be defined as bounded by the lines x=±a, y=c, and y=c+b, and the third zone can be defined as bounded by the lines x=±a, y=−c, and y=−c−b.

With reference to this layout, the wire paths can be designed such that the gradient coils produce a current density in the first zone such that $$J_y(x) = \sum_{n,m} B_{nm} \cos \frac{n\pi x}{a}$$

and $J_x$ is substantially zero, to generate a Y gradient field in the imaging volume. The gradient field component generated by the gradient coils in the first zone can be used to capture an image of an object component within the imaging volume. The discrete wires in the first zone can be disposed on wire paths that are substantially straight lines aligned in the y-direction. Further, the wire paths can be designed such that the gradient coils produce a current density in each of the second zone and the third zone such that $$J_y(x, y) = \sum_{n,m} B_{nm} \cos \frac{n\pi x}{a} \cos\left[\left(m + \frac{1}{2}\right)\pi \frac{(y-c)}{b}\right] \text{ and}$$

$$J_x(x, y) = \sum_{n,m} A_{nm} \sin \frac{n\pi x}{a} \sin\left[\left(m + \frac{1}{2}\right)\pi \frac{(y-c)}{b}\right]$$

to generate an X gradient field or a Y gradient field in the imaging volume. In this case, the discrete wires disposed in the second and third zones can be current returns for the gradient coil components in the first zone, and can be disposed on wire paths that are curved lines in the z-plane. Further, the discrete wires forming the gradient coils can be shaped in the second zone and the third zone to produce a current density such that $J_y$ is substantially zero for $|y| \geq b+c$.

The wire paths can be designed such that the gradient coils produce a current density in the first zone such that $$J_y = \sum_{nm} B_{nm} \sin\left(n + \frac{1}{2}\right)\frac{\pi x}{a}$$

and $J_x$ is substantially zero, to generate a Z gradient field in the imaging volume. In this case, the discrete wires in the first zone can be disposed on wire paths that are substantially straight lines aligned in the y-direction. Further, the discrete wires forming the gradient coils in each of the second zone and the third zone can be shaped to produce a current density such that $J_y = 0$ for $|y| \geq b+c$.

In all the above cases, the wire paths in the first zone can be substantially straight lines, and the wire paths in the second and third zones can be curved lines.

According to another aspect of the present invention, a magnetic resonance imaging system includes a pair of opposing magnets that provide a main magnetic field in an imaging volume, a pair of magnet poles, and a pair of gradient coils. The magnet poles are disposed opposing faces of respective magnets. The gradient coils are formed from discrete wires disposed along wire paths, one on each magnet pole. Each magnet pole is divided into a plurality of zones, such that each zone is defined by a shape of the wire path in that zone. The shape in each zone corresponds to a mathematical series. The mathematical series corresponding to the shapes are different in at least two of the zones.

The system can include a current source, connected to the gradient coils to provide a current through the gradient coils; thereby providing the gradient field. Each gradient coil can provide a linear gradient field in a target region of the imaging volume, and the target region can have a rectangular cross-section in a plane parallel to the poles.

The wire paths in each said zone can be shaped to correspond to a truncated generalized Fourier series. The truncated generalized Fourier series can approximate the current density in the corresponding zone, according to predetermined design constraints. The number of terms of the truncated generalized Fourier series can be limited according to the design constraints. The truncated generalized Fourier series can be an orthogonal set of functions, such as Bessel functions, or functions including at least one sinusoidal term.

The poles can be rectangular-shaped, and each magnet pole can be divided into three zones. For example, with reference to a Cartesian coordinate system, each said magnet pole can be disposed in the plane z=constant. The first zone can then be defined as bounded by the lines x=±a and y=±c, the second zone can be defined as bounded by the lines x=±a, y=c, and y=c+b, and the third zone can be defined as bounded by the lines x=±a, y=-c, and y=-c-b.

With reference to the foregoing exemplary layout, the wire paths can be shaped such that the gradient coils produce a current density in the first zone such that $$J_y(x) = \sum_{nm} B_{nm} \cos \frac{n\pi x}{a}$$

and $J_x$ is substantially zero, to generate a Y gradient field in the imaging volume. The discrete wires in the first zone can be disposed on wire paths that are straight lines aligned in the y-direction. Further, the wire paths can be shaped such that the gradient coils produce a current density in each of the second zone and the third zone such that $$J_y(x, y) = \sum_{n,m} B_{nm} \cos \frac{n\pi x}{a} \cos\left[\left(m + \frac{1}{2}\right)\pi \frac{(y-c)}{b}\right] \quad \text{and}$$

$$J_x(x, y) = \sum_{n,m} A_{nm} \sin \frac{n\pi x}{a} \sin\left[\left(m + \frac{1}{2}\right)\pi \frac{(y-c)}{b}\right]$$

to generate an X gradient field or a Y gradient field in the imaging volume. The discrete wires in the second and third zones can be disposed on wire paths that are curved lines in the z-plane. Further, the wire paths can be shaped such that the gradient coils produce a current density such that $J_y=0$ for $|y|\geq b+c$.

Further, the wire paths can be shaped such that the gradient coils produce a current density in the first zone such that $$J_y = \sum_{nm} B_{nm} \sin\left(n + \frac{1}{2}\right)\frac{\pi x}{a}$$

and $J_x$ is substantially zero, to generate a Z gradient field in the imaging volume. The discrete wires in the first zone can be disposed on wire paths that are straight lines aligned in the y-direction. Thus, the discrete wires in the first zone can be disposed on wire paths that are substantially straight lines aligned in the y-direction, and the discrete wires in the second and third zones can be disposed on wire paths that are curved lines in the z-plane.

DETAILED DESCRIPTION OF THE INVENTION

A single mathematical series, such as a Fourier series, valid over a two-dimensional region, can be used to describe the current density needed to produce a magnetic field having a particular gradient. Wire paths are used to form gradient coils that produce the current density when current flows through the wires. The wire paths can have shapes that are designed such that the resulting current density approximates the idealized current density described by the mathematical series. The series used to model the current density can be truncated to an extent that the physical design is made more practical, while the approximation still falls within an acceptable range of the ideal current density. According to the present invention, the current density function is represented differently, that is, by different mathematical series, in different zones of the magnet pole on which the wire paths are disposed. Thus, the wire paths are laid out differently in each zone, corresponding to the different series used to model the respective current densities. The current densities in the different zones are devised such that they are continuous over the boundaries separating the different zones.

Thus, a current density that produces a good gradient can be approximated using discrete wires carrying an actual current. In a broad sense, the present invention is contemplated to include all gradient coil designs in which two or more current density functions are utilized to produce the overall gradient field, such that each current density is valid in its respective zone. This feature is particularly applicable for use with a rectangular pole magnet in situations requiring a linear gradient over a large rectangular region. For example, FIG. 1 shows such a rectangular pole face, separated into a number of zones.

Figure 1:
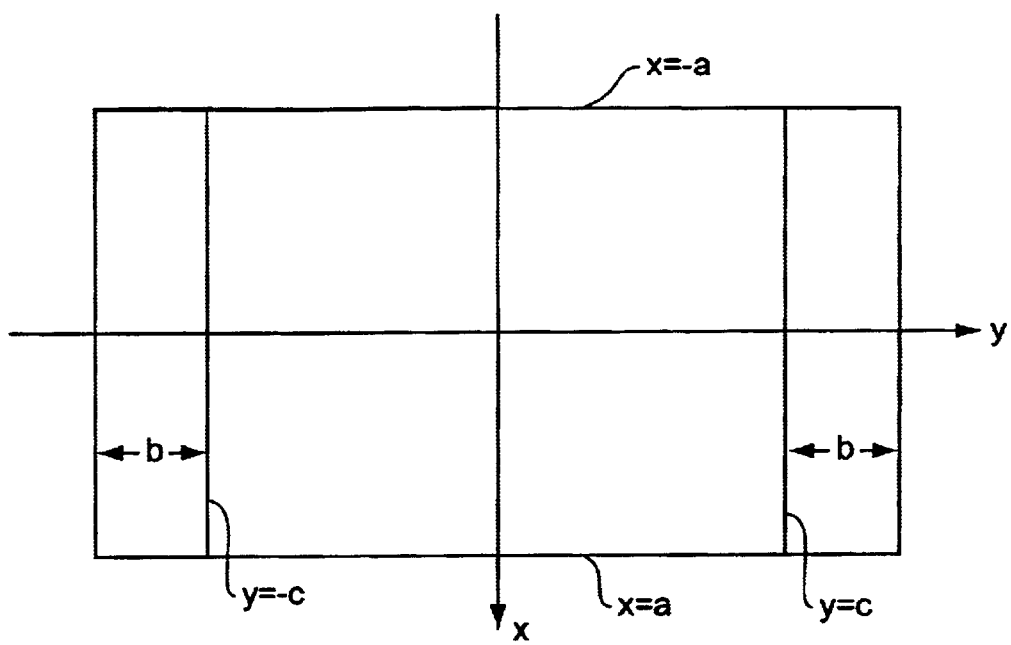
FIG. 1 is a diagram of an area of a magnet pole according to the present invention, separated into zones for current density determination.

The area shown in FIG. 1 can be one of two opposing magnet poles, for example, the bottom pole in a vertical field MRI system, or a portion, such as a central portion, of a pole face. To produce an X (or Y) gradient, the current density on the top pole preferably is substantially the same as that for the bottom pole. For a Z gradient, the current density on the top pole is the negative of that on the bottom pole.

In the zone bounded by $|x|=a$ and $|y|=c$, which includes the origin, the current density is modeled as a series, such as $$J_y(x) = \sum_{n,m} B_{nm} \cos \frac{n\pi x}{a} \quad y \leq c \quad \text{(Eq. 1)}$$

$$J_x = 0,$$

where m and n are integers. This current density can be implemented by straight wires running in the y direction, such that the current density is constant in a direction along the length of the wires. For y≧c, the current density is modeled as $$J_y(x, y) = \sum_{n,m} B_{nm} \cos\frac{n\pi x}{a} \cos\left[\left(m + \frac{1}{2}\right)\pi\frac{(y-c)}{b}\right] \quad \langle\text{Eq. 2}\rangle$$

$$J_x(x, y) = \sum_{n,m} A_{nm} \sin\frac{n\pi x}{a} \sin\left[\left(m + \frac{1}{2}\right)\pi\frac{(y-c)}{b}\right]$$

Note that $J_x$ and $J_y$ are continuous at $|y|=c$ and $J_y=0$ at $y=b+c$. This current density can be approximated by using curved wires corresponding to the series in the z-plane.

The sine and cosine functions used in the equations set forth above are illustrative, and can be replaced by other functions, such as the Bessel functions, in accordance with the present invention.

The design procedure consists of finding values for coefficients $A_{nm}$ and $B_{nm}$ that produce a sufficiently good gradient field over the desired range. An optimization program can be utilized to determine the coefficients.

Note that the current continuity equation $$\frac{\partial J_x}{\partial x} + \frac{\partial J_y}{\partial y} = 0 \quad \langle\text{Eq. 3}\rangle$$

requires that $$B_{nm} = A_{nm}\frac{n}{\left(m + \frac{1}{2}\right)}\frac{b}{a} \quad \langle\text{Eq. 4}\rangle$$

Thus, only one set of coefficients need be found.

Once the desired current density is determined, discrete wires can be arranged to produce an approximation of the calculated value, which in turn will generate an approximation of the target gradient field according to principles that are well known to those of skill in the art.

The Z gradient (z is perpendicular to the magnet poles) can be determined according to the following equations:

$$\text{For } |y| \leq c \quad J_y = \sum_{nm} B_{nm} \sin\left(n + \frac{1}{2}\right)\frac{\pi x}{a} \quad \langle\text{Eq. 5}\rangle$$

$$J_x = 0$$

$$\text{For } |y| \geq c \quad J_y = \sum B_{nm} \sin\frac{\left(n + \frac{1}{2}\right)\pi x}{a} \cos\left[\left(m + \frac{1}{2}\right)\pi\frac{(y-c)}{b}\right] \quad \langle\text{Eq. 6}\rangle$$

$$J_x = \sum A_{nm} \cos\frac{\left(n + \frac{1}{2}\right)\pi x}{a} \sin\left[\left(m + \frac{1}{2}\right)\pi\frac{(y-c)}{b}\right]$$

where continuity requires that $$B_{nm} = -A_{nm}\frac{\left(n + \frac{1}{2}\right)b}{\left(m + \frac{1}{2}\right)a} \quad \langle\text{Eq. 7}\rangle$$

Figure 2:
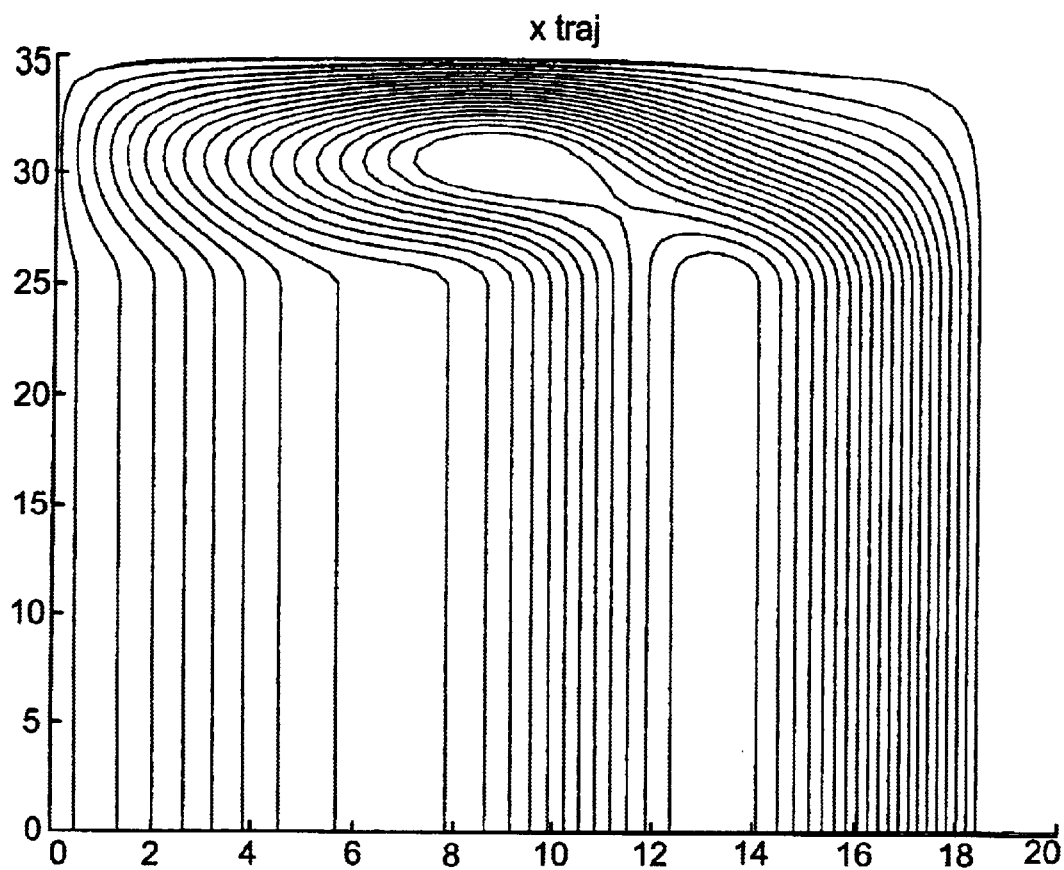
FIG. 2 is a diagram of exemplary gradient coils on one pole quadrant for an X gradient according to the present invention.

A diagram of the wires for one quadrant for an X gradient is shown in FIG. 2. This is the primary plane, that is, the plane closest to the center of the magnet.

Figure 3:
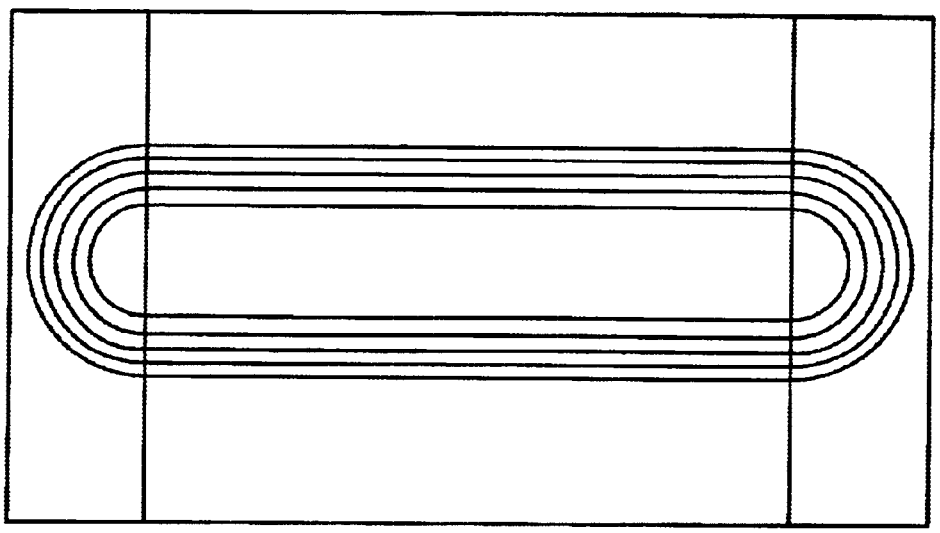
FIG. 3 is a diagram of exemplary gradient coils on a rectangular pole for a Y gradient according to the present invention.

For a Y gradient, each half of the pole can be divided into three sections covering different Y values. As shown in FIG. 3, the wires are straight in the central section, and curved in the other two.

Thus, as described, a gradient field is generated by the current density produced by gradient coils. The gradient coils are formed of discrete wires. The wire paths are laid out to provide a current density that approximates an ideal current density determined according to a mathematical series. The plane on which the wire paths are disposed is divided into at least two zones. The mathematical series describing the current densities are different in each of the zones. This allows for high-quality gradients to be provided for magnet geometries that conventionally are not used, such as by disposing the wire paths on rectangular pole faces.

Particular exemplary embodiments of the present invention have been described in detail. These exemplary embodiments are illustrative of the inventive concept recited in the appended claims, and are not limiting of the scope or spirit of the present invention as contemplated by the inventors.

What is claimed is:

1. A process of providing a gradient field, comprising:
   providing a pair of opposing magnets and associated magnet poles on opposite sides of an imaging volume;
   dividing each said magnet pole into a plurality of zones;
   for each said zone, determining a target gradient field;
   for each said zone, determining a target current density that corresponds to the target gradient field;
   modeling the target current density for each said zone after a mathematical series corresponding to that zone;
   forming gradient coils from a plurality of discrete wires disposed along wire paths defined by the mathematical series corresponding to each said zone; and
   connecting a current source to the gradient coils to provide currents through the gradient coils, thereby providing the gradient field;
   wherein at least one said mathematical series corresponding to one said zone is different than at least one other said mathematical series corresponding to the one other said zone; and
   wherein the mathematical series modeling the current densities at boundaries of adjacent ones of said zones are continuous.

2. The process of claim 1, wherein the mathematical series approximate the target current densities according to predetermined design constraints.

3. The process of claim 2, wherein the number of terms of the mathematical series is limited according to the design constraints.

4. The process of claim 1, wherein the gradient field is a linear gradient field in a target region of the imaging volume.

5. The process of claim 4, wherein the target region has a rectangular cross-section in a plane parallel to opposing surfaces of the poles.

6. The process of claim 1, wherein the mathematical series is a truncated generalized Fourier series.

7. The process of claim 6, wherein the truncated generalized Fourier series is an orthogonal set of functions.

8. The process of claim 7, wherein the orthogonal set of functions includes a Bessel function.

9. The process of claim 7, wherein the orthogonal set of functions includes at least one sinusoidal term.

10. The process of claim 1, wherein the poles are rectangular-shaped.

11. The process of claim 10, wherein dividing each said magnet pole into a plurality of zones includes dividing each said magnet pole into three zones.

12. The process of claim 11, further comprising:
    disposing each said magnet pole in a plane z=constant, with reference to a Cartesian coordinate system;

defining the first zone of said three zones as bounded by the lines x=±a and y=±c;

defining the second zone of said three zones as bounded by the lines x=±a, y=c, and y=c+b; and defining the third zone of said three zones as bounded by the lines x=±a, y=−c, and y=−c−b.

13. The process of claim 12, further comprising designing the wire paths such that the gradient coils produce a current density in the first zones such that $$J_y(x) = \sum_{n,m} B_{nm} \cos \frac{n\pi x}{a}$$

and $J_x$ is substantially zero, to generate a Y gradient field in the imaging volume.

14. The process of claim 13, wherein the gradient field component generated by the gradient coils in the first zone is used to capture an image of an object component within the imaging volume.

15. The process of claim 13, wherein the discrete wires in the first zone are disposed on wire paths that are substantially straight lines aligned in the y-direction.

16. The process of claim 13, further comprising designing the wire paths such that the gradient coils produce a current density in each of the second zone and the third zone such that $$J_y(x, y) = \sum_{n,m} B_{nm} \cos \frac{n\pi x}{a} \cos\left[\left(m + \frac{1}{2}\right)\pi \frac{(y-c)}{b}\right] \text{ and}$$

$$J_x(x, y) = \sum_{n,m} A_{nm} \sin \frac{n\pi x}{a} \sin\left[\left(m + \frac{1}{2}\right)\pi \frac{(y-c)}{b}\right]$$

to generate one of an X gradient field and a Y gradient field in the imagining volume.

17. The process of claim 16, wherein the discrete wires disposed in the second and third zones are current returns for the gradient coil components in the first zone.

18. The process of claim 16, wherein the discrete wires in the second and third zones are disposed on wire paths that are curved lines in the z-plane.

19. The process of claim 16, further comprising shaping the discrete wires forming the gradient coils in each of the second zone and the third zone to produce a current density such that $J_y$ is substantially zero for $|y| \geq b+c$.

20. The process of claim 12, further comprising designing the wire paths such that the gradient coils produce a current density in the first zone such that $$J_y = \sum_{nm} B_{nm} \sin\left(n + \frac{1}{2}\right) \frac{\pi x}{a}$$

and $J_x$ is substantially zero, to generate a Z gradient field in the imaging volume.

21. The process of claim 12, wherein the discrete wires in the first zone are disposed on wire paths that are substantially straight lines aligned in the y-direction.

22. The process of claim 20, further comprising shaping the discrete wires forming the gradient coils in each of the second zone and the third zone to produce a current density such that $J_y=0$ for $|y| \geq b+c$.

23. The process of claim 12, wherein the wire paths in the first zone are substantially straight lines, and the wire paths in the second and third zones are curved lines.

24. A magnetic resonance imaging system, comprising:

a pair of opposing magnets that provide a main magnetic field in an imaging volume;

a pair of magnet poles, wherein one of each said magnet poles is disposed on an opposing face of a respective one of said pair of opposing magnets; and a pair of gradient coils, formed from discrete wires disposed along wire paths, wherein one of each said gradient coils is disposed on a respective one of said pair of magnet poles;

wherein each said magnet pole is divided into a plurality of zones;

wherein each said zone is associated with a corresponding mathematical series;

wherein a shape of the wire path in each said zone is defined by the corresponding mathematical series; and wherein the mathematical series associated with at least one of the zones is different than the mathematical series associated with at least one other of the zones.

25. The system of claim 24, further comprising a current source, connected to the gradient coils to provide a current through the gradient coils, thereby providing the gradient field.

26. The system of claim 25, wherein each said gradient coil provides a linear gradient field in a target region of the imaging volume.

27. The system of claim 26, wherein the target region has a rectangular cross-section in a plane parallel to the poles.

28. The system of claim 24, wherein the wire paths in each said zone are shaped to correspond to a truncated generalized Fourier series.

29. The system of claim 28, wherein the truncated generalized Fourier series approximates the current density in the corresponding zone, according to predetermined design constraints.

30. The system of claim 29, wherein a number of terms of the truncated generalized Fourier series is limited according to the design constraints.

31. The system of claim 28, wherein the truncated generalized Fourier series is an orthogonal set of functions.

32. The system of claim 31, wherein the orthogonal set of functions includes Bessel functions.

33. The system of claim 31, wherein the orthogonal set of functions includes at least one sinusoidal term.

34. The system of claim 24, wherein the poles are rectangular-shaped.

35. The system of claim 34, wherein each said magnet pole is divided into three zones.

36. The system of claim 35, wherein, with reference to a Cartesian coordinate system, each said magnet pole is disposed in the plane z=constant, and the first zone of said three zones is bounded by the lines x=±a and y=±c;

the second zone of said three zones is bounded by the lines x=±a, y=c, and y=c+b; and the third zone of said three zones is bounded by the lines x=±a, y=−c, and y=−c−b.

37. The system of claim 36, wherein the wire paths are shaped such that the gradient coils produce a current density in the first zone such that $$J_y(x) = \sum_{n,m} B_{nm} \cos \frac{n\pi x}{a}$$

and $J_x$ is substantially zero, to generate a Y gradient field in the imaging volume.

38. The system of claim 37, wherein the discrete wires in the first zone are disposed on wire paths that are straight lines aligned in the y-direction.

39. The system of claim 37, wherein the wire paths are shaped such that the gradient coils produce a current density in each of the second zone and the third zone such that $$J_y(x,y) = \sum_{n,m} B_{nm} \cos \frac{n\pi x}{a} \cos\left[\left(m+\frac{1}{2}\right)\pi \frac{(y-c)}{b}\right] \quad \text{and}$$

$$J_x(x,y) = \sum_{n,m} A_{nm} \sin \frac{n\pi x}{a} \sin\left[\left(m+\frac{1}{2}\right)\pi \frac{(y-c)}{b}\right]$$

to generate one of an X gradient field and a Y gradient field in the imaging volume.

40. The system of claim 39, wherein the discrete wires in the second and third zones are disposed on wire paths that are curved lines in the z-plane.

41. The system of claim 39, wherein the wire paths are shaped such that the gradient coils produce a current density such that $J_y=0$ for $|y| \geq b+c$.

42. The system of claim 36, wherein the wire paths are shaped such that the gradient coils produce a current density in the first zone such that $$J_y = \sum_{nm} B_{nm} \sin\left(n+\frac{1}{2}\right)\frac{\pi x}{a}$$

and $J_x$ is substantially zero, to generate a Z gradient field in the imaging volume.

43. The system of claim 42, wherein the discrete wires in the first zone are disposed on wire paths that are straight lines aligned in the y-direction.

44. The system of claim 36, wherein the discrete wires in the first zone are disposed on wire paths that are substantially straight lines alighted in the y-direction, and the discrete wires in the second and third zones are disposed on wire paths that are curved lines in the z-plane.

* * * * *